(12) United States Patent
Co et al.

(10) Patent No.: US 9,412,714 B2
(45) Date of Patent: Aug. 9, 2016

(54) WIRE BOND SUPPORT STRUCTURE AND MICROELECTRONIC PACKAGE INCLUDING WIRE BONDS THEREFROM

(71) Applicant: Invensas Corporation, San Jose, CA (US)

(72) Inventors: Reynaldo Co, Santa Cruz, CA (US); Wael Zohni, San Jose, CA (US); Rizza Lee Saga Cizek, Brentwood, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/291,874

(22) Filed: May 30, 2014

(65) Prior Publication Data
US 2015/0348928 A1    Dec. 3, 2015

(51) Int. Cl.
*H01L 23/02* (2006.01)
*H01L 23/00* (2006.01)
(Continued)

(52) U.S. Cl.
CPC ............ *H01L 24/17* (2013.01); *H01L 21/56* (2013.01); *H01L 23/3107* (2013.01);
(Continued)

(58) Field of Classification Search
CPC .......... H01L 2224/73265; H01L 2224/48227; H01L 2224/32225; H01L 2924/15311; H01L 2224/32145; H01L 2224/97; H01L 2224/48247; H01L 2224/49171; H01L 2224/32245; H01L 2924/10253; H01L 24/48; H01L 21/56; H01L 2224/16227; H01L 2224/73204; H01L 2224/73253; H01L 23/3107; H01L 23/34; H01L 23/49811; H01L 23/49827; H01L 23/49833; H01L 23/5226

USPC ........... 257/686, 723, 738, 777, 784, E23.023
See application file for complete search history.

(56) References Cited

U.S. PATENT DOCUMENTS 3,289,452 A    12/1966  Koellner
3,358,897 A    12/1967  Christensen
(Continued)

FOREIGN PATENT DOCUMENTS

CN    1641832 A    7/2005
CN    1877824 A    12/2006
(Continued)

OTHER PUBLICATIONS

Taiwan Office Action for Application No. 101138311 dated Jun. 27, 2014.
(Continued)

*Primary Examiner* — H Tsai
(74) *Attorney, Agent, or Firm* — Lerner, David, Littenberg, Krumholz & Mentlik, LLP

(57) ABSTRACT

A microelectronic package may include a substrate having first and second regions, a first surface and a second surface remote from the first surface; at least one microelectronic element overlying the first surface within the first region; electrically conductive elements at the first surface within the second region; a support structure having a third surface and a fourth surface remote from the third surface and overlying the first surface within the second region in which the third surface faces the first surface, second and third electrically conductive elements exposed respectively at the third and fourth surfaces and electrically connected to the conductive elements at the first surface in the first region; and wire bonds defining edge surfaces and having bases electrically connected through ones of the third conductive elements to respective ones of the second conductive elements and ends remote from the support structure and the bases.

10 Claims, 8 Drawing Sheets

(51) Int. Cl.
  *H01L 23/34*    (2006.01)
  *H01L 23/31*    (2006.01)
  *H01L 21/56*    (2006.01)
  *H01L 23/522*   (2006.01)
  *H01L 23/498*   (2006.01)

(52) U.S. Cl.
  CPC ......... *H01L 23/34* (2013.01); *H01L 23/49811* (2013.01); *H01L 23/49833* (2013.01); *H01L 23/5226* (2013.01); *H01L 24/81* (2013.01); *H01L 23/49827* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2924/014* (2013.01); *H01L 2924/15321* (2013.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |

(56) References Cited

U.S. PATENT DOCUMENTS

| | | |
|---|---|---|
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,304,900 B2 | 11/2012 | Jang et al. |
| 8,314,492 B2 | 11/2012 | Egawa |
| 8,319,338 B1 | 11/2012 | Berry et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 | 9/2014 | Chau et al. |
| 8,878,353 B2 | 11/2014 | Haba et al. |
| 8,927,337 B2 | 1/2015 | Haba et al. |
| 8,987,132 B2 | 3/2015 | Gruber et al. |
| 9,095,074 B2 | 7/2015 | Haba et al. |

(56) References Cited

U.S. PATENT DOCUMENTS

| | | |
|---|---|---|
| 9,123,664 B2 | 9/2015 | Haba |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0015353 A1 | 1/2007 | Craig et al. |
| 2007/0090524 A1 | 4/2007 | Abbott |
| 2007/0148822 A1 | 6/2007 | Haba et al. |
| 2007/0181989 A1* | 8/2007 | Corisis ............... H01L 21/561 257/686 |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0127686 A1 | 5/2009 | Yang et al. |
| 2009/0128176 A1 | 5/2009 | Beaman et al. |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |

(56) References Cited

U.S. PATENT DOCUMENTS

| | | |
|---|---|---|
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0193937 A1 | 8/2010 | Nagamatsu et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2012/0007232 A1 | 1/2012 | Haba |
| 2012/0015481 A1 | 1/2012 | Kim |
| 2012/0018885 A1 | 1/2012 | Lee et al. |
| 2012/0025365 A1 | 2/2012 | Haba |
| 2012/0043655 A1 | 2/2012 | Khor et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086130 A1 | 4/2012 | Sasaki et al. |
| 2012/0104595 A1 | 5/2012 | Haba et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2013/0049221 A1 | 2/2013 | Han et al. |
| 2013/0069222 A1 | 3/2013 | Camacho |
| 2013/0105979 A1 | 5/2013 | Yu et al. |
| 2013/0134588 A1 | 5/2013 | Yu et al. |
| 2013/0241083 A1 | 9/2013 | Yu et al. |
| 2014/0021605 A1* | 1/2014 | Yu ..................... H01L 25/50 257/738 |
| 2014/0036454 A1 | 2/2014 | Caskey et al. |
| 2014/0124949 A1 | 5/2014 | Paek et al. |
| 2015/0017765 A1 | 1/2015 | Co et al. |

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 2004-172157 A | 6/2004 |
| JP | 2004281514 A | 10/2004 |
| JP | 2004-319892 A | 11/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20150012285 A | 2/2015 |
| TW | 200810079 A | 2/2008 |
| TW | 200933760 A | 8/2009 |

(56) References Cited

FOREIGN PATENT DOCUMENTS

| TW | 201023277 A | 6/2010 |
|---|---|---|
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2010041630 A1 | 4/2010 |
| WO | 2010101163 A1 | 9/2010 |
| WO | 2014107301 A1 | 7/2014 |

OTHER PUBLICATIONS

Korean Office Action for Application No. 2014-7025992 dated Feb. 5, 2015.
Taiwanese Office Action for Application No. 100140428 dated Jan. 26, 2015.
Japanese Office Action for Application No. 2013-520777 dated May 22, 2015.
Chinese Office Action for Application No. 201310264264.3 dated May 12, 2015.
International Search Report and Written Opinion for Application No. PCT/US2011/024143 dated Jan. 17, 2012.
Partial International Search Report for Application No. PCT/US2015/033004 dated Sep. 9, 2015.
Chinese Office Action for Application No. 201180022247.8 dated Sep. 16, 2014.
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.
International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, Stats ChipPAC Ltd.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US20131052883 dated Oct. 21, 2013.
Japanese Office Action for Application No. 2013-509325 dated Oct. 18, 2013.
Office Action from U.S. Appl. No. 12/769,930 mailed May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20. 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Taiwanese Office Action for Application No 102106326 dated Sep. 18, 2015.

\* cited by examiner

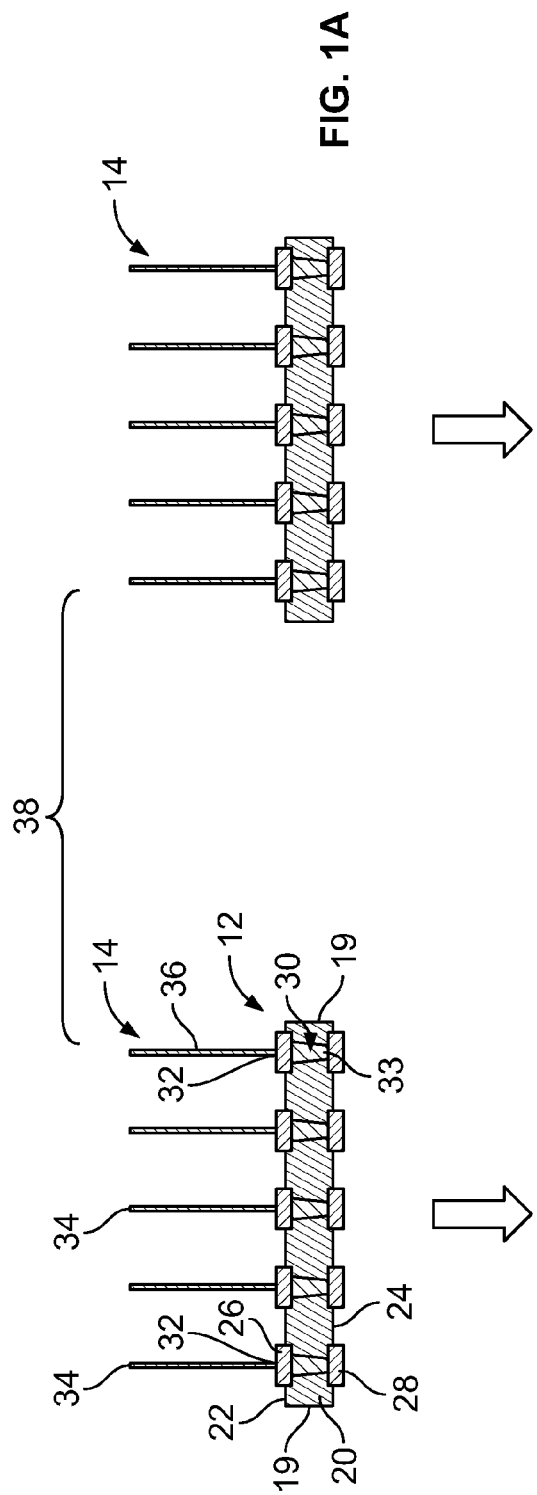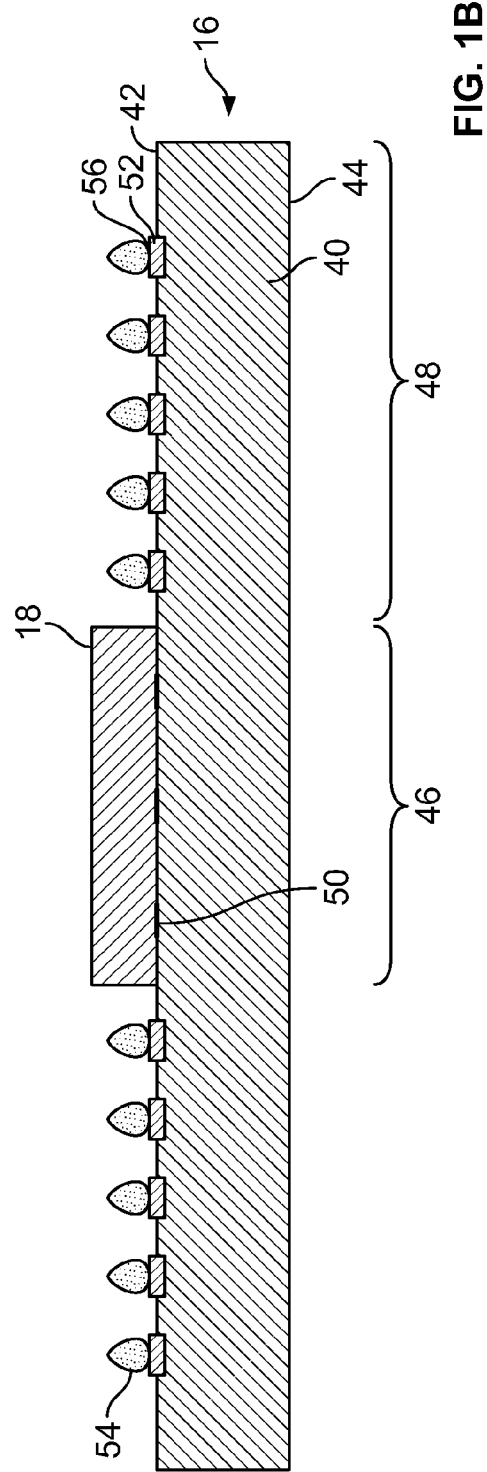

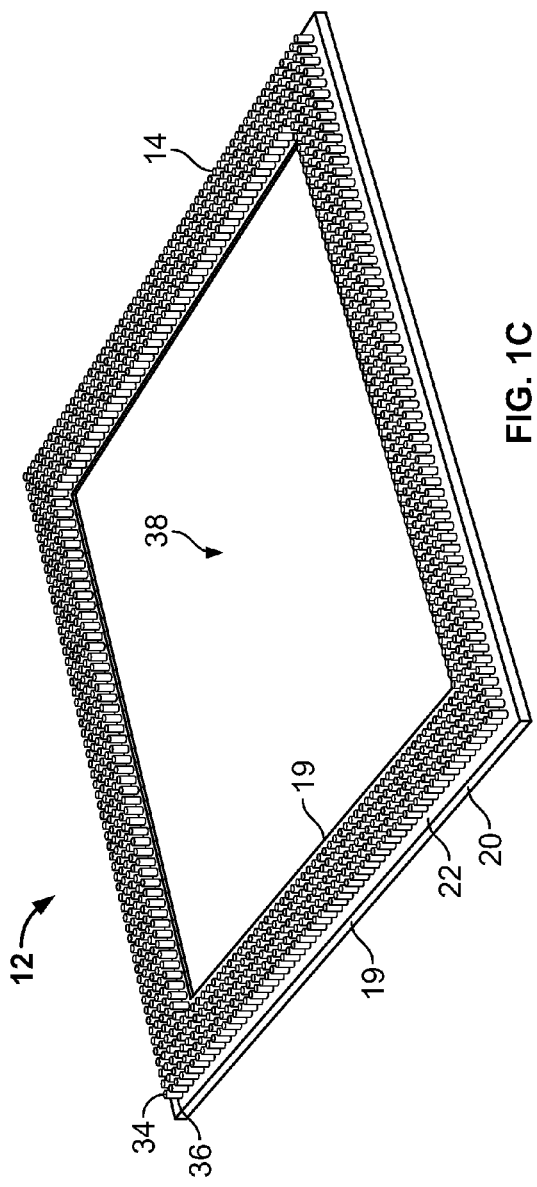
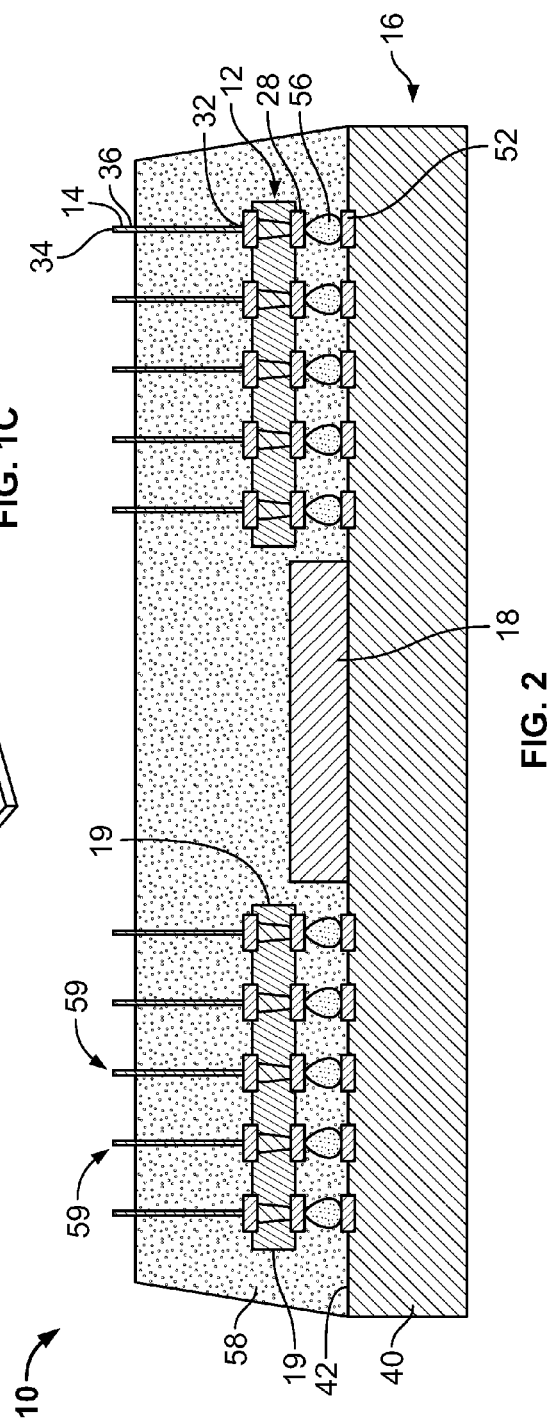
FIG. 1C
FIG. 2

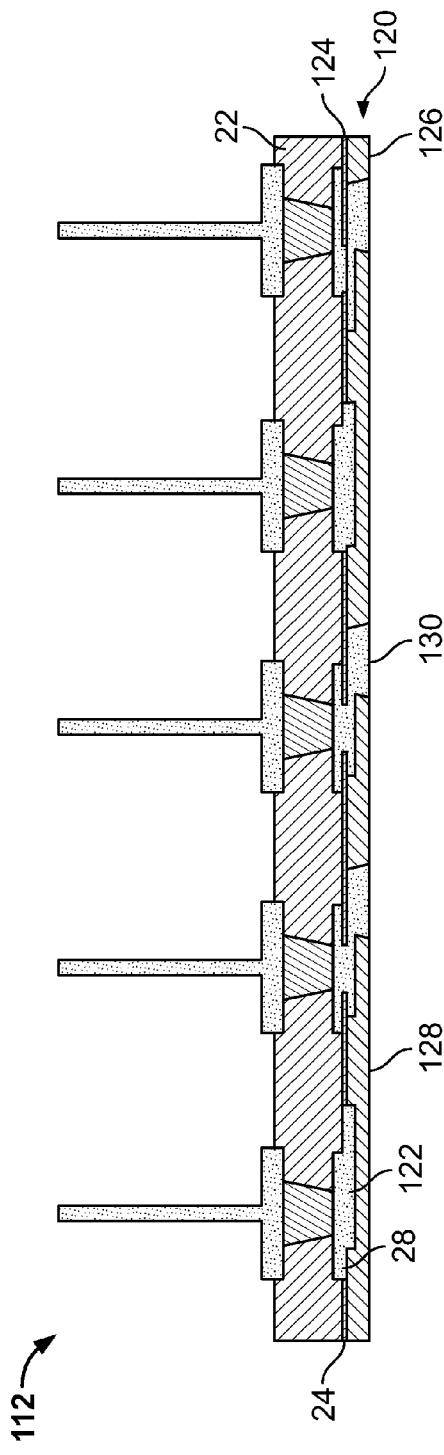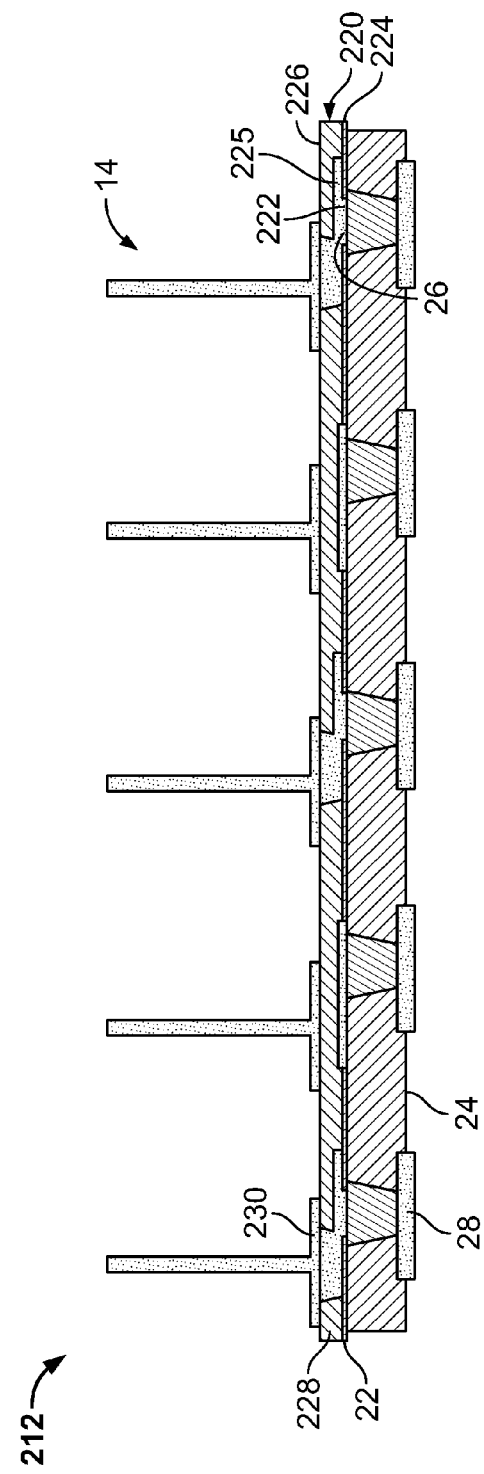

WIRE BOND SUPPORT STRUCTURE AND MICROELECTRONIC PACKAGE INCLUDING WIRE BONDS THEREFROM

BACKGROUND OF THE DISCLOSURE

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent to each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in interconnection elements incorporating a bond via array and methods of making such interconnection elements would be desirable.

SUMMARY OF THE DISCLOSURE

In accordance with an embodiment of the disclosure, a microelectronic package may include a substrate having a first region and a second region, the substrate having a first surface and a second surface remote from the first surface; at least one microelectronic element overlying the first surface within the first region; electrically conductive elements at the first surface of the substrate within the second region; a support structure having a third surface and a fourth surface remote from the third surface and overlying the first surface within the second region in which the third surface faces the first surface, the support structure having second and third electrically conductive elements exposed respectively at the third and fourth surfaces, the second electrically conductive elements being electrically connected to the conductive elements at the first surface of the substrate in the first region; and wire bonds defining edge surfaces and having bases electrically connected through ones of the third conductive elements to respective ones of the second conductive elements and ends remote from the support structure and the bases.

In accordance with an embodiment of the disclosure, a microelectronic package may include a substrate having a first region and a second region, the substrate having a first surface and a second surface remote from the first surface; at least one microelectronic element overlying the first surface within the first region; electrically conductive elements exposed at the first surface of the substrate within the second region; wire bonds defining edge surfaces, having ends electrically connected to respective ones of the conductive elements at the first surface in the first region through respective second electrically conductive elements and having bases remote from the substrate and the ends; third electrically conductive elements respectively overlying and electrically connected with the bases of the wire bonds; and a dielectric encapsulation layer extending from at least one of the first or second surfaces and covering portions of the third electrically conductive elements and covering the wire bonds such that the wire bonds are separated from one another by the encapsulation layer, the encapsulation layer overlying at least the second region of the substrate, and, wherein unencapsulated portions of the third electrically conductive elements are defined by portions of the third electrically conductive elements that are uncovered by the encapsulation layer, the unencapsulated portions including surfaces of the third electrically conductive elements remote from the bases.

In accordance with an embodiment of the disclosure, a method of making a structure may include joining a support structure including wire bonds to a substrate, wherein the substrate has a first surface and a second surface remote from the first surface and a plurality of conductive elements at a the first surface, wherein a support structure has a third surface and a fourth surface remote from the third surface and second and third electrically conductive elements exposed respectively at the third and fourth surfaces, the second electrically conductive elements being electrically connected to the conductive elements at a first portion of the first surface of the substrate, wherein the wire bonds define edge surfaces and have bases electrically connected through ones of the third conductive elements to respective ones of the second conductive elements and ends remote from the support structure and the bases; and forming a continuous dielectric encapsulation element on the substrate and the support structure, wherein the dielectric element is formed overlying and extending from the first portion of the first surface and filling spaces between and covering portions of the wire bonds such that the covered portions of the wire bonds are separated from one another by the encapsulation element, wherein unencapsulated portions of the wire bonds are defined by portions of the wire bonds that are uncovered by the encapsulation element, the unencapsulated portions including the ends, the encapsulation element overlying at least the first portion and the fourth surface of the support structure and defining a second portion of the first surface, the second portion being other than the first portion and having an area sized to accommodate an entire area of a microelectronic element, and at least some of the conductive elements at the first surface are at the second portion and configured for connection with the microelectronic element.

In accordance with an embodiment of the disclosure, a method of making a structure may include joining wire bonds of a support structure to a substrate having a first region and a second region, wherein the substrate has a first surface and a second surface remote from the first surface and a plurality of conductive elements at the first surface, wherein a support structure has a third surface and a fourth surface remote from the third surface and second electrically conductive elements exposed at the third surface, the second electrically conductive elements being electrically connected to the conductive elements at a first portion of the first surface of the substrate by wire bonds, wherein the wire bonds define edge surfaces, have ends and have bases remote from the ends and electrically connected to the second electrically conductive elements, wherein the joining includes bonding the ends with respective ones of the conductive elements at the second region of the first surface of the substrate by flowing third electrically conductive elements through which the respective ones of the conductive elements at the first surface are electrically connected with the ends of the wire bonds; and forming a dielectric element on the substrate and removing support structure, wherein the dielectric element is formed overlying and extending from the second region of the first surface and filling spaces between and covering portions of the wire bonds such that the covered portions of the wire bonds are separated from one another by the encapsulation element, wherein unencapsulated portions of the second electrically conductive elements are defined by portions of the second electrically conductive elements that are uncovered by the encapsulation layer when the support structure is removed, the unencapsulated portions including surfaces of the second electrically conductive elements remote from the bases of the wire bonds, the dielectric element overlying at least the first region of the first surface, the first region being other than the second region and having an area sized to accommodate an entire area of at least one microelectronic element.

In accordance with an embodiment of the disclosure, a structure may include a substrate having a first surface and a second surface remote from the first surface, and conductive vias extending therein; first and second electrically conductive elements exposed respectively at the first and second surfaces; a plurality of wire bonds defining edge surfaces and having bases electrically connected through ones of the first conductive elements and ones of the conductive vias to respective ones of the second conductive elements and ends remote from the substrate and the bases, the edge surface of each wire bond being separated from the edge surface of adjacent wire bonds, wherein the substrate defines at least one opening interior of portions of the first surface having an area sized to accommodate an entire area of a microelectronic element.

BRIEF DESCRIPTION OF THE DRAWINGS

FIG. 1A is a diagrammatic sectional view of an in-process unit according to an embodiment of the disclosure.

FIG. 1B is a diagrammatic sectional view of a microelectronic assembly according to an embodiment of the disclosure.

FIG. 1C is a top plan view of the in-process unit of FIG. 1A.

FIG. 2 is a diagrammatic sectional view of a microelectronic package including the in-process unit of FIG. 1A and the microelectronic assembly of FIG. 1B according to an embodiment of the disclosure.

FIG. 3 is a diagrammatic sectional view of an in-process unit according to another embodiment of the disclosure.

FIG. 4 is a diagrammatic sectional view of an in-process unit according to another embodiment of the disclosure

DETAILED DESCRIPTION

Figure 5:
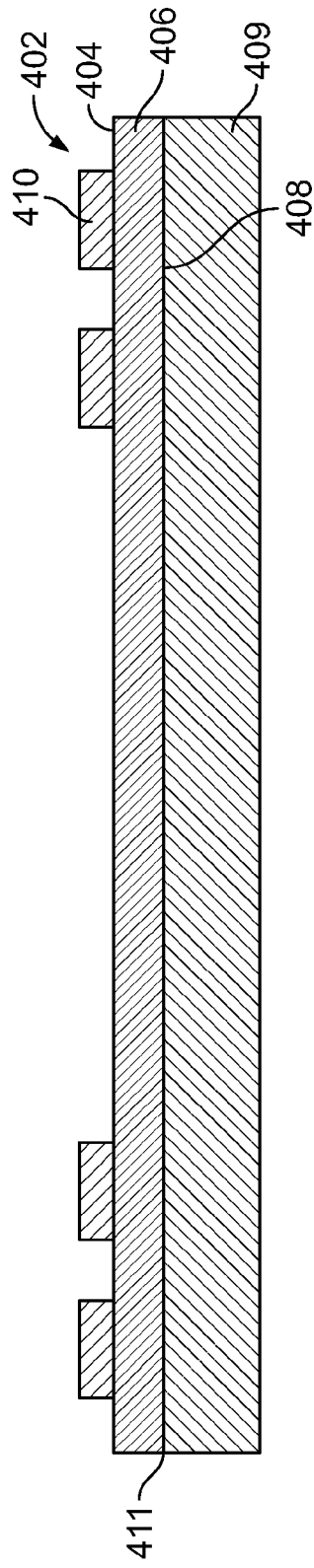
FIGS. 5-9 are diagrammatic sectional views illustrating stages in a method of fabricating a microelectronic package according to an embodiment of the disclosure.

A microelectronic package 10 may be fabricated by joining and electrically connecting wire bonds 14 extending from a support structure 12 with a microelectronic assembly 16 including a microelectronic element 18, such as a semiconductor chip, in accordance with an embodiment of the disclosure, as shown in FIGS. 1A, 1B, 1C and 2. The chip may embody a plurality of active devices (e.g., transistors, diodes, etc.), a plurality of passive devices (e.g., resistors, capacitors, inductors, etc.), or both active devices and passive devices. In a particular embodiment, the chip may be configured to have a predominant function as a logic chip, e.g., a programmable general or special purpose processor, a microcontroller, a field programmable gate array ("FPGA") device, an application specific integrated circuit ("ASIC"), a digital signal processor, among others, or a predominant function other than as a logic chip, such as a memory, for example, a volatile memory storage area, e.g., dynamic random access memory ("DRAM"), static random access memory ("SRAM"), a nonvolatile memory storage array such as flash memory or magnetic random access memory ("MRAM"). As such, the embodiment of FIG. 2 is in the form of a packaged microelectronic element such as a semiconductor chip assembly that is used in computer or other electronic applications.

Referring to FIGS. 1A and 1C, the support structure 12 may include a substrate 20 having a first surface 22 and a second surface 24, and opposing edge surfaces 19 extending from the surface 22 to the surface 24. The substrate 20 typically is in the form of a dielectric element, which is substantially flat. The dielectric element may be sheet-like and may be thin. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials.

The first surface 22 and second surface 24 may be substantially parallel to each other and spaced apart at a distance perpendicular to the surfaces 22, 24 defining the thickness of the substrate 12. The thickness of substrate 12 may be within a range of generally acceptable thicknesses for the present application. In an embodiment, the distance between the first surface 22 and the second surface 24 is between about 10-500 μm. For purposes of this discussion, the first surface 22 may be described as being positioned opposite or remote from second surface 24. Such a description, as well as any other description of the relative position of elements used herein that refers to a vertical or horizontal position of such elements is made for illustrative purposes only to correspond with the position of the elements within the drawings, and is not limiting.

Electrically conductive elements 26 and 28, in the form of contacts or pads, may be arranged, respectively, at the first and second surfaces 22, 24. As used in the present description, when an electrically conductive element is described as being "at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a conductive structure that is exposed at a surface of a dielectric structure may project from such surface; may be flush with such surface; or may be recessed relative to such surface and exposed through a hole or depression in the dielectric. The conductive elements 26, 28 may be flat, thin elements which are respectively aligned in a direction of the thickness of the substrate 20. The conductive elements 26, may be a solid metal material, such as copper, gold, nickel, Palladium or other materials that are acceptable for such an application, including various alloys including one or more of copper, gold, nickel, palladium or combinations thereof.

At least some of conductive elements 26 may be interconnected to corresponding conductive elements 28. Such an interconnection may be completed using vias 30 formed in substrate 20 that can be lined or filled with conductive metal that can be formed of the same material as conductive elements 26, 28.

A plurality of wire bonds 14 may be joined electrically with at least some of the conductive elements 26. The wire bonds 14 may be bonded at a base 32 thereof, such as a ball bond or a wedge bond, to the conductive element 26. Each of the wire bonds 14 may extend to a free end 34 remote from the base 32 of such wire bond and remote from substrate 20, and include an edge surface 36 extending from the free end 34 to the base 32. As described below, the ends 34 of wire bonds 14 are characterized as being free in that they are not electrically connected or otherwise joined to microelectronic element 18 or any other conductive features within microelectronic package 10 that are, in turn, connected to microelectronic element 18. In other words, free ends 34 are available for electrical connection, either directly or indirectly as through a solder ball or other features discussed herein, to a conductive feature external to package 10 when the wire bonds 14 are joined to the microelectronic assembly 16. The fact that ends 34 are held in a predetermined position by, for example, an encapsulation layer in the package 10 as discussed herein (see FIG. 2) or otherwise joined or electrically connected to another conductive feature does not mean that they are not "free" as described herein, so long as any such feature is not electrically connected to microelectronic element 18. Conversely, base 32 is not free as it is either directly or indirectly electrically connected to microelectronic element 18, as described herein. The particular size and shape of base 32 can vary according to the type of material used to form wire bond 14, the desired strength of the connection between wire bond 14 and conductive element 26, or the particular process used to form wire bond 14. The wire bonds 14 may have a construction and be formed on the substrate 20 extending from the conductive elements 26 in any suitable manner, such as described in U.S. 2013/0093087, filed Feb. 24, 2012, incorporated by reference herein.

The substrate 20 having the wire bonds 14 joined with the conductive elements 26 at the surface 22 and extending therefrom, and the conductive elements 26 electrically connected to respective conductive elements 28 at the surface 24 through the vias 30, may serve as an in-process unit in the form of the support structure 12 that supports the wire bonds 14 before the wire bonds are joined with the microelectronic assembly 16, such as illustrated in FIG. 1B and FIG. 2 and discussed in detail below. In one embodiment, the support structure 12 may be configured in the form of a frame surrounding an open, interior region 38 having dimensions sufficient to receive components therein, such as a microelectronic element 18 as shown in FIG. 2.

Referring to FIG. 1B, the microelectronic assembly 16 may include a substrate 40 having a first surface 42 and a second surface 44. The substrate 40 may have a similar shape and configuration as the substrate 20, as described above. The substrate 40, unlike the substrate 20, may have terminals for further electrical interconnection with a circuit panel, e.g., a circuit board. Alternatively, the substrate 40 can be a circuit panel or circuit board. In one example thereof, the substrate 40 can be a module board of a dual-inline memory module ("DIMM"). In yet another variation, the substrate 40 can be a microelectronic element such as a semiconductor chip embodying a plurality of active devices, e.g., in form of an integrated circuit or otherwise. In one embodiment, the substrate 40 may be considered as divided into a first region 46 and a second region 48. The first region 46 lies within the second region 48 and includes a central portion of the substrate 40 and extends outwardly therefrom. The second region 48 substantially surrounds the first region 46 and extends outwardly therefrom to the outer edges of the substrate 40. In this embodiment, no specific characteristic of the substrate 40 itself physically divides the two regions; however, the regions are demarked for purposes of discussion herein with respect to treatments or features applied thereto or contained therein.

The microelectronic element 18 may be mounted to first surface 42 of the substrate 40 within first region 46. Microelectronic element 18 may be a semiconductor chip or another comparable device. In the embodiment of FIG. 1B, the microelectronic element 18 is mounted to the first surface 42 as a "flip-chip" configuration, where contacts (not shown) on the microelectronic element 18 may be connected to conductive elements 50 at the surface 42 within the first region 46, such as by solder bumps or the like (not shown) that are positioned beneath microelectronic element 18. In an embodiment, conductive elements 50 are formed from materials similar to those from which the elements 26, 28 are formed.

The conductive elements 50 may further include pads or contacts 52 within the second region 48 at the surface 42. At least some of conductive elements 50 may be interconnected to the pads 52, and at least some of the conductive elements and pads 52 may be connected to conductive pads or terminals (not shown) at the surface 44 of the substrate 40. Such an interconnection can be completed using vias (not shown) formed in the substrate 40 that can be lined or filled with conductive metal, similarly as described above for the support structure 20. Optionally, conductive elements 50 and pads 52 can be further interconnected to one another by traces on the substrate 40.

Third conductive elements 54, such as formed of a conductive paste or solder or other conductive masses, may overlie and contact surfaces 56 of the pads 52 remote from and opposite the surface 42 of the substrate 40. In one embodiment, stenciling, dispensing, screen printing, controlled spraying, e.g., a process similar to inkjet printing, or transfer molding may be used to form conductive elements 54 on the pads 52. The elements 54 may be a bond material metal or bond metal, similar to the elements 50. The pads 52 may be arranged in a pattern within the second region so as to be aligned in a thickness direction of the assembly 16 with respective pads 28 of the support structure 12, which are arranged in a predetermined pattern, when the wire bonds 14 of the support structure 12 are joined with the assembly 16 as shown in FIG. 2, to form the microelectronic package 10. In the microelectronic package 10, corresponding pads 28 are joined and electrically connected to pads 52 through the conductive elements 56, and the wire bonds 14 hence may be electrically connected to contacts of the microelectronic element 18 and conductive elements of the assembly 16.

Microelectronic assembly 10 further may include an encapsulation layer 58 formed from a dielectric material. In the embodiment of FIG. 2, encapsulation layer 58 is formed, such as by film-assisting molding or like techniques, over the portions of first surface 42 of substrate 40 that are not otherwise covered by or occupied by microelectronic element 18, or conductive elements 50. Similarly, encapsulation layer 58 is formed over the portions of conductive elements 52 that are not otherwise covered by the conductive elements 56, uncovered portions of the conductive elements 56, uncovered portions of the conductive elements 26, 28, portions of the surfaces 22, 24 not otherwise covered by the conductive elements 26, 28, and the edges 19 of the support structure 12. Encapsulation layer 58 may also substantially cover the microelectronic element 18, the wire bonds 14, including the bases 32 and at least a portion of edge surfaces 36 thereof. A portion of wire bonds 14 may remain uncovered by encapsulation layer 58, which can also be referred to as unencapsulated portions 59, thereby making the wire bond available for electrical connection to a feature or element located outside of encapsulation layer 58. In embodiments, at least end surfaces 34 of wire bonds 14 and optionally portions of the edges surfaces 36 may remain uncovered by encapsulation layer 58, such as described in US 2013/0093087, incorporated by reference herein. In other words, encapsulation layer 58 may cover all of microelectronic package 10 from first surface and above, with the exception of a portion of the wire bonds 14, such as end surfaces 34, edge surfaces 36 or combinations of the two.

Encapsulation layer 58, which can be an integral, continuous layer, serves to protect the other elements within microelectronic package 10, particularly wire bonds 14. This allows for a more robust structure that is less likely to be damaged by testing thereof or during transportation or assembly to other microelectronic structures. Encapsulation layer 58 may be formed from a dielectric material with insulating properties such as that described in U.S. Patent App. Pub. No. 2010/0232129, which is incorporated by reference herein.

Advantageously, the microelectronic assembly 16 may be fabricated completely and independently, and the wire bonds 14 may be joined thereto using the support structure 12, which is also fabricated independently, to obtain the microelectronic package 10.

In another embodiment as shown in FIG. 3, a support structure 112 having components the same or similar to the support structure 12 as described above, may further include a redistribution layer 120 of dielectric material extending along the surface 24. Traces 122 at surface 124 of the redistribution layer 120, the surface 124 being remote from surface 22 of the support structure 12 and remote from and opposite surface 126 of the redistribution layer 120, may be electrically connected to contact pads 28. Traces 122 of the redistribution layer 120 can be electrically coupled between the electrically conductive elements 28 and pads 130 at the surface 126. The pads 130 are arranged at the surface 126, such that similar to the support structure 12 and as shown in FIG. 1, wire bonds 14 may be electrically connected with at least some of the pads 52, through traces 122 connected with pads 130 which are aligned with the pads 52 at the surface 42 of the assembly 16. In one embodiment, the redistribution layer 120 may overlie only a portion of the surface 24 of the support structure 12 and the pads 28. The redistribution layer 120, in effect, serves as what is known as a fan-out layer that may allow the support structure 12 to connect to an array of different configurations of pads 52 at the surface 42 of the microelectronic assembly 16 than the array of conductive elements 26 at the surface 22 of the support structure 112 would otherwise permit.

In another embodiment as shown in FIG. 4, a support structure 212 having components the same or similar to the support structure 12 as described above, may include a redistribution layer 220 of dielectric material extending along the surface 22. Traces 222 of the redistribution layer 220 may be electrically coupled between the electrically conductive elements 26 and electrically conductive elements 230 at a surface 226 of the redistribution layer. In one embodiment, the traces can be at the surface 224 facing the surface 22 of the support structure 212 and remote from and opposite the surface 226 of the redistribution layer 220, and may be electrically connected to contact pads 225 at the surface 224. The pads 225 may be arranged at the surface 224 to contact the pads 26 at the surface 22. The pads 230 at the surface 226 may be joined to bases of wire bonds 14, similar to the connection with the pads 26 in the support structure 12 and as shown in FIG. 1A. The redistribution layer 212, thus, may provide that the wire bonds 14 may be electrically connected with at least some of the pads 26, through traces 222 electrically connected with pads 230 and pads 225 which are aligned with the pads 26 at the surface 22 of the support structure 212. In one embodiment, the redistribution layer 220 may overlie only a portion of the surface 22 of the support structure 212 and the pads 26. The redistribution layer 220, in effect, serves as a fan-out layer that may allow the support structure 212 to connect to an array of different configurations of pads 52 at the surface 42 of the microelectronic assembly 16 than the conductive element 26 array at the surface 22 of the support structure 212 would otherwise permit.

In a further embodiment, a support structure may have a redistribution layer at a surface of the support structure that can be joined with a surface of a microelectronic assembly, such as the assembly 16, and the surface of the support structure to which the wire bonds are joined and extend therefrom.

FIGS. 5-9 show steps for manufacturing a microelectronic package 400 in accordance with another embodiment of the disclosure. Referring to FIG. 5, a first metallization layer 402, such as including copper or like conductive materials, may be deposited on a surface 404 of a release layer 406, which is attached at a surface 408, remote from the surface 404, to a temporary substrate 409 using an adhesive layer 411. The metal layer 402 may be deposited in some manner, such as by patterning of a metal foil, such as a copper foil, as suitable, to obtain conductive elements 410, in the form of pads or contacts similar to the conductive elements 26 as described above, arranged on the release layer 406.

Figure 6:
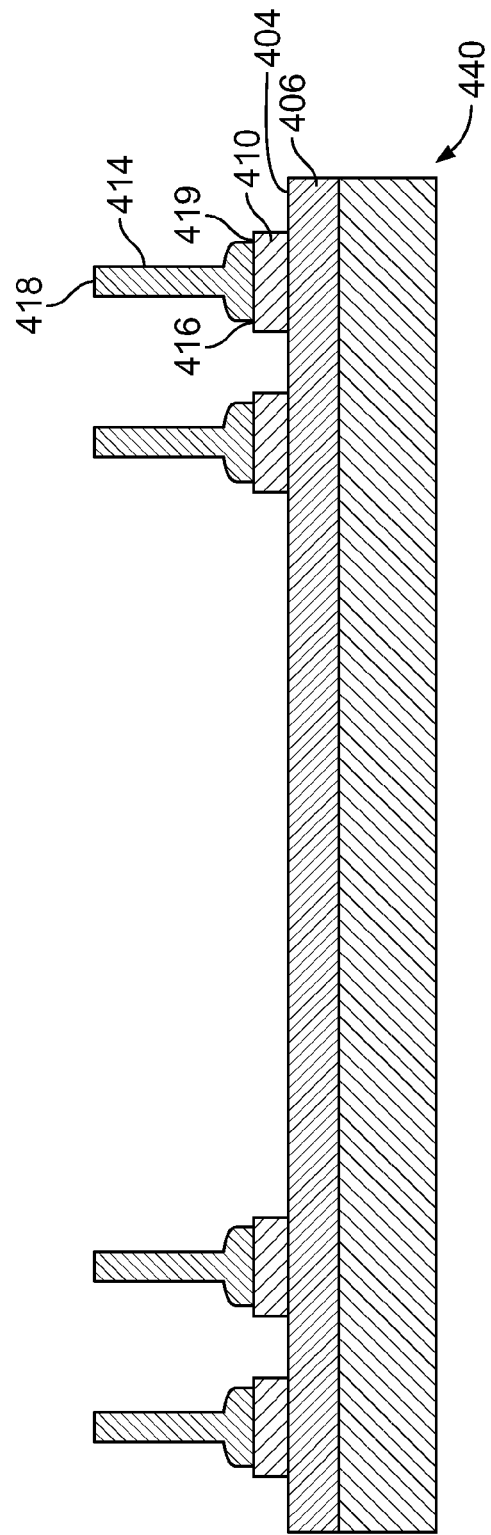
Figure 7:
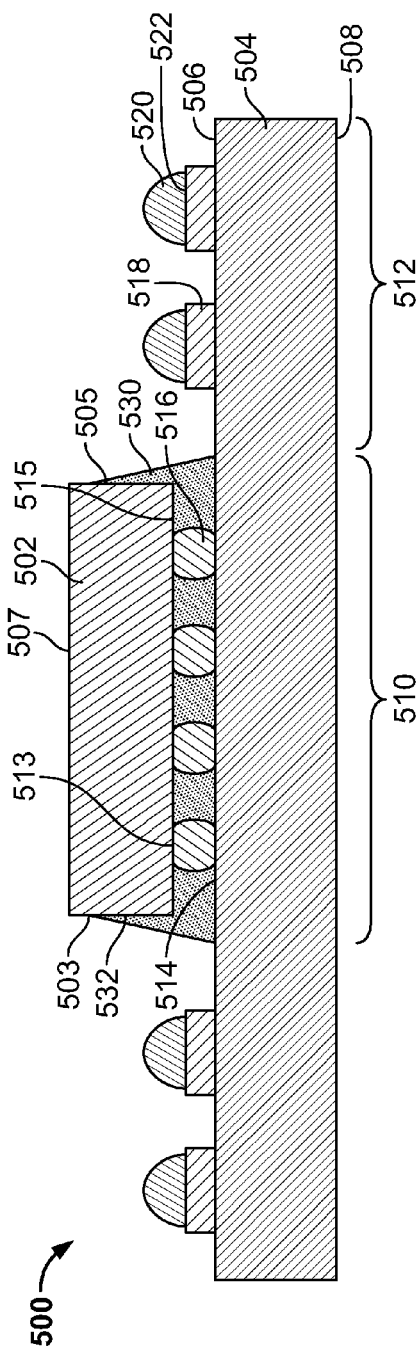

Referring to FIG. 6, wire bonds 414 having bases 416 and free ends 418 remote from the bases, such as described above for the wire bonds 14, may be electrically connected to the conductive elements 410, for example, by joining bases 416 which are in the form of ball bonds or wedge bonds to surfaces 419 of the elements 410 which are remote from the surface 404 of the release layer 406. The structure as illustrated in FIG. 6 is an in-process unit 440 including wire bonds 414 arranged for joining to contact pads of a microelectronic assembly, such as assembly 500 as shown in FIG. 7. As the wire bond array of the unit 440 is formed separately from the microelectronic assembly 500, potential contamination of the contact surfaces of the wire bonds during manufacture of the microelectronic assembly may be avoided.

Figure 8:
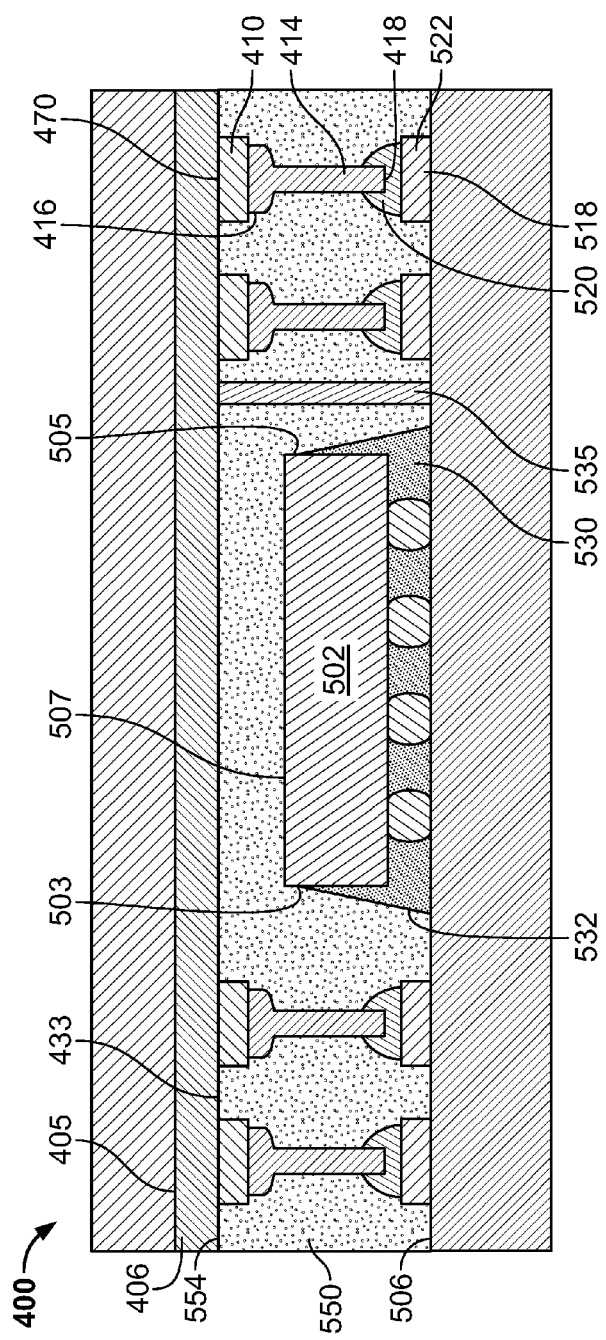
Figure 9:
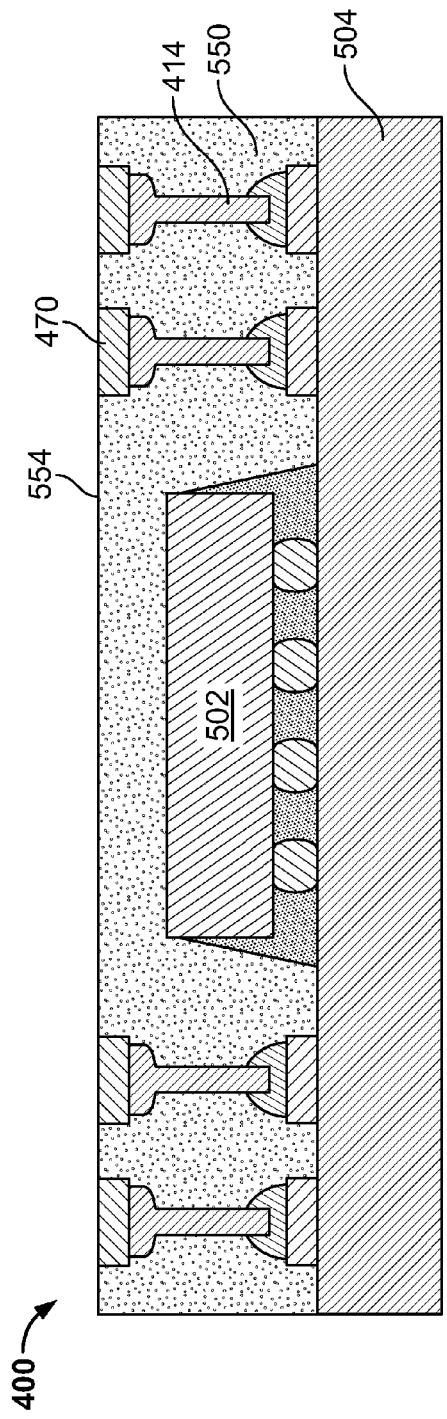

Referring to FIG. 7, the microelectronic assembly 500 may be assembled to provide for electrical connections between a microelectronic element 502 thereof and the wire bonds 414 of the in-process unit 440, when the wire bonds 414 are joined to the assembly 500 to form the package 400 as illustrated in FIGS. 8-9. The assembly 500 may include a substrate 504, which may include logic components and electrical connections thereto (not shown), having a first surface 506 and a second surface 508 remote from the first surface 506. The substrate 504 may have a similar shape and configuration as the substrate 20, as described above. In one embodiment, the substrate 504 may be considered as divided into a first region 510 and a second region 512. The first region 510 lies within the second region 512 and includes a central portion of the substrate 504 and extends outwardly therefrom. The second region 512 substantially surrounds the first region 510 and extends outwardly therefrom to the outer edges of the substrate 504.

The microelectronic element 502, which may be a semiconductor chip or another comparable device, may be mounted to the first surface 506 of the substrate 504 within first region 510 as a flip-chip configuration, similar to the microelectronic element 18 of the assembly 16. Contacts 513 on the microelectronic element 502 at a surface 515 facing the surface 506 may be electrically connected to conductive elements 514 within the first region 510 at the surface 506 by conductive masses 516, such as solder bumps, conductive paste or the like, positioned beneath the microelectronic element 502. In an embodiment, the conductive elements 514 are formed from materials similar to those from which the conductive elements of the package 10 are formed.

The conductive elements 514 may further include pads or contacts 518 within the second region 512 at the surface 506. At least some of conductive elements 514 may be interconnected to the pads 518 through electrically conductive traces (not shown), and also electrically connected with electronic components (not shown) in the substrate 504 through the conductive traces within the substrate 504. At least some of the conductive elements 514 and pads 518 may be connected to conductive pads or terminals (not shown) at the surface 508 of the substrate 504. Such an interconnection can be completed using vias (not shown) formed in the substrate 504 lined or filled with conductive metal, similarly as described above for the assembly 16. In this manner, the first microelectronic element 502 may be electrically interconnected with the at least some of the contacts or terminals at the surface 508. Optionally, conductive elements 514 and pads 518 can be further interconnected to one another by traces on the substrate 504.

Electrically conductive masses 520, such as formed of a conductive paste, solder or like materials, may overlie and contact surfaces 522 of the pads 518 remote from and opposite the surface 506 of the substrate 504. The masses 520 may be made of the same or similar material as the masses 516, and be formed on the surface 506 in any order or simultaneously with respect to formation of the masses 516, using the same or similar techniques as described above for the masses 56.

Microelectronic assembly 500 further may include an encapsulation layer 530 formed from a dielectric material. In the embodiment of FIG. 7, the encapsulation layer 530 may be formed, such as by molding, over portions of the conductive elements 514 and contacts 513 of the microelectronic assembly 502 not otherwise covered by the masses 514, portions of the masses 516 that are uncovered, and portions of the first surface 506 of substrate 504 in the region 510 that are not otherwise covered by another element. In addition, the encapsulation layer 530 may be formed over opposing side surfaces 503, 505 of the microelectronic element 502 that extend from the surface 515 to a surface 507 of the element 502 remote from and opposite the surface 515. The layer 530 may protect microelectronic element 502 to avoid electrical short circuiting between wire bonds 414 when the wire bonds 414 are joined with the assembly 500, so to help avoid malfunction or possible damage due to unintended electrical contact between a wire bond 414 and the microelectronic element 502. In one embodiment, the layer 530 may mechanically reinforce the joints between contacts 513 of the microelectronic element and the corresponding contacts 514 to which they are joined.

In one embodiment, the conductive masses 520 may be formed over the pads 518 subsequent to formation of the dielectric layer 530 covering the microelectronic element 502 and a portion of the surface 506 at the region 510.

Referring to FIGS. 6-8, the pads 518 may be arranged in a pattern within the second region 512 so as to be aligned in a thickness direction of the assembly 500 with respective ends 418 of wire bonds 414, which are arranged in a predetermined pattern, when the in-process unit 440 is joined with the assembly 500, during a step of fabricating the package 400. In the package 400, respective pads 518 may be electrically connected with pads 410 through the masses 520 and the wire bonds 414. In one embodiment, the conductive masses 520 may be caused to reflow, after which the in-process unit 440 may joined with the assembly 500 by being joined with respective ends 418 of the wire bonds 414.

In one embodiment, when joining the in-process unit 440 with the assembly 500, spacers or stand-offs 535, such as made of dielectric material, may be provided extending from the surface 506 of the assembly 500 to a surface 433 of the release layer 406 of the in-process unit 440 facing the surface 506 of the assembly 500. The spacers 535 may avoid the free standing wire bonds 414 of the in-process unit 440 from bending or becoming deformed due to the mass of the unit 440, before dielectric material is provided between the surfaces 433 and 506 as discussed below.

Subsequent to the wire bonds 414 being joined respectively with the pads 518 through the conductive masses 520, a second encapsulation layer 550 formed from a dielectric material may be formed over uncovered portions of surfaces of components between, and uncovered portions of surfaces of, the release layer 406 and the surface 506. In the embodiment of FIG. 8, the encapsulation layer 550 may be formed over portions of the pads 518 and pads 410 not otherwise covered by the masses 520 and the bases 416 of the wire bonds 414, uncovered portions of the wire bonds 414 and the masses 520, portions of the surface 506 of substrate 504 in the region 510 or 512 (shown in FIG. 7) that are not otherwise covered by another element, an uncovered outer surface 532 of the encapsulation layer 530, and any uncovered portions of the surfaces 503, 505 or 507 of the microelectronic element 502. The encapsulation layer 550 may define a major surface 554, which is remote from the surface 506 of the substrate 504 and is adjacent a surface 433 of the release layer 406 facing the surface 506. Surfaces 470 of the conductive elements 410, which are remote from the surfaces of the elements 410 to which the bases 416 are joined, remain uncovered by the encapsulation layer 550 within the major surface 554.

Referring to FIG. 9, after the encapsulation layer 550 is formed, the release layer and the temporary substrate may be removed from the encapsulation layer 550, such as by applying a suitable chemical to dissolve the release layer which may be an adhesive. In one embodiment, the release layer may be from a water soluble plastic material such that it can be removed by exposure to water without affecting the other components of the in-process unit or the package. In another embodiment, the release layer may be removed from the encapsulation layer 550 after exposure to ultraviolet light. After removal of the release layer and the temporary substrate, the surfaces 470 remain uncovered and, thus, available for electrical connection and being joined to other components, such as traces, pads or terminals of another microelectronic assembly or package.

Figure 10:
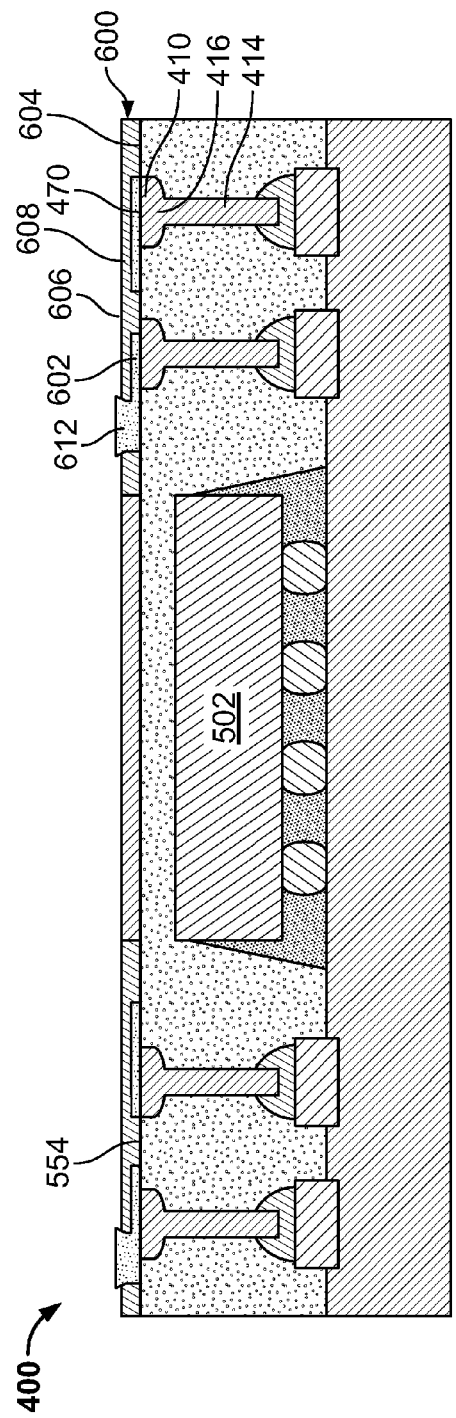
FIG. 10 is a diagrammatic sectional of a microelectronic package including a redistribution layer at an outer surface of the package according to an embodiment of the disclosure.

In one embodiment, referring to FIG. 10, the package 400 may further include a redistribution layer 600 of dielectric material extending along the surface 554. Traces 602 of the redistribution layer 600 may be electrically coupled between the conductive elements 410 and electrically conductive pads 612 at a surface of the redistribution layer 600. In one embodiment, as shown in FIG. 9, traces 602 may extend along the surface 604 facing the surface 554 and remote from surface 606 of the redistribution layer 600, and may be electrically connected with the conductive elements 410 by contacting the surfaces 470 thereof. The traces 602 may be coupled to the pads 612 by electrically conductive structure such as vias extending through the redistribution layer 600 to pads 612 at the surface 606. The pads 612 may be arranged at the surface 606 to provide for connection to external electrically conductive elements of another external component, such that the wire bonds 414 may electrically connect the microelectronic element 502 with the external component through the traces 602 connected with pads 612, which are aligned in a direction of the thickness of the package 400 with the surfaces 470 of the pads 410. The redistribution layer 600, in effect, serves as a fan-out layer of the interconnects of the assembly 500, which are limited to the periphery of the top surface of the assembly 500, to the full area array at a top surface 554 of the encapsulation layer 550.

Figure 11:
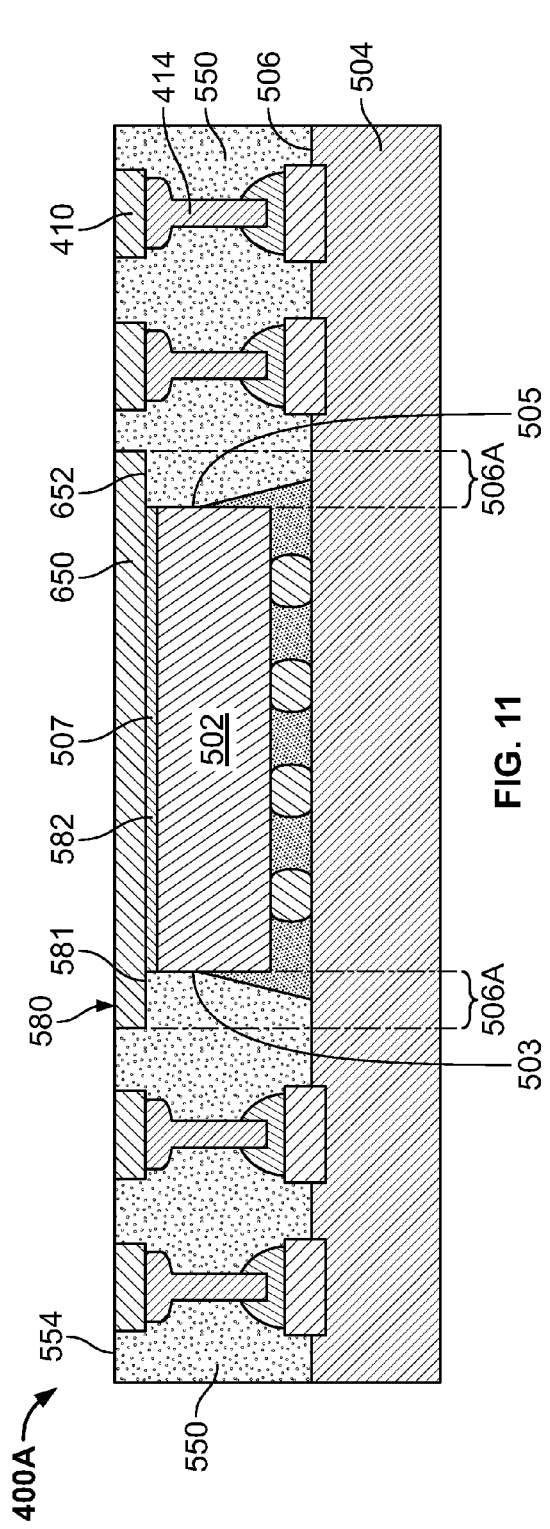
FIG. 11 is a diagrammatic sectional of a microelectronic package including a thermally conductive element according to an embodiment of the disclosure.

In another embodiment, referring to FIG. 11, a microelectronic package 400A may have a similar construction to the package 400 as described above, except that the package 400A may further include a thermally conductive element or heat spreader 650 to remove heat generated by the microelectronic element. The thermally conductive element 650 may be disposed overlying the surface 507 of the microelectronic element 502 and respective portions 506A of the surface 506 of the substrate 504 extending away from the element 502 from locations aligned in a direction of the thickness of the package 400A with the side surfaces 503, 505. A portion of the encapsulation layer 550 may separate the heat spreader 650 from the wire bonds 414 and any electrically conductive elements joined with and extending away from the bases of the wire bonds, so as to electrically insulate the heat spreader 650 from such any other electrically conductive component of the package. In one embodiment, a portion 580 of the encapsulation layer 550 overlying the microelectronic element 502 and the portions 506A of the surface 506 may be removed by photolithography or like techniques, to define an open recess 580. In one example, laser ablation can be used to recess the encapsulation layer 550 uniformly to form a planar recessed surface 581 within the portion 580 extending from the surface 507 of the microelectronic element 502. Techniques that can be used to remove at least portions of the encapsulation layer selectively may include "wet blasting" techniques. In wet blasting, a stream of abrasive particles carried by a liquid medium is directed towards a target to remove material from the surface of the target. The stream of particles may sometimes be combined with a chemical etchant which may facilitate or accelerate the removal of material selectively to other structure such as the conductive elements 410 which are to remain after wet blasting.

The heat spreader 650, which may include copper or like thermally conductive material, may then be deposited or patterned at the surface 554 so as to be formed in the recess 580. A thermally conductive material in the form of an adhesive or grease 582, which may be applied first on the surface 507 or a portion of the surface 652 to confront the surface 507, may attach the element 650 to the microelectronic element 502. In one embodiment, the thermally conductive material is not electrically conductive so that the element 650 is electrically isolated from the microelectronic element 502. The thermally conductive material 582 may transfer heat between the microelectronic element 502 and the element 650 so as to remove heat from the package 400A.

In another embodiment, spreader 650 similar to that shown in FIG. 11 may be formed during formation of a first metallization layer 402 shown in FIG. 5. The same metal of the layer 402, such as copper, may be patterned to form the pads 410 at a periphery of the layer 402, while a larger microelectronic element attach pad serving as spreader 650 is formed at an interior or center portion of the layer 402. Thermal paste 582 may be applied at the surface 507 of the microelectronic element 502 in the assembly 500. The in-process-unit formed from the metal layer 402 as described in this embodiment may then be joined with the assembly 500, similarly as described above.

Figure 12:
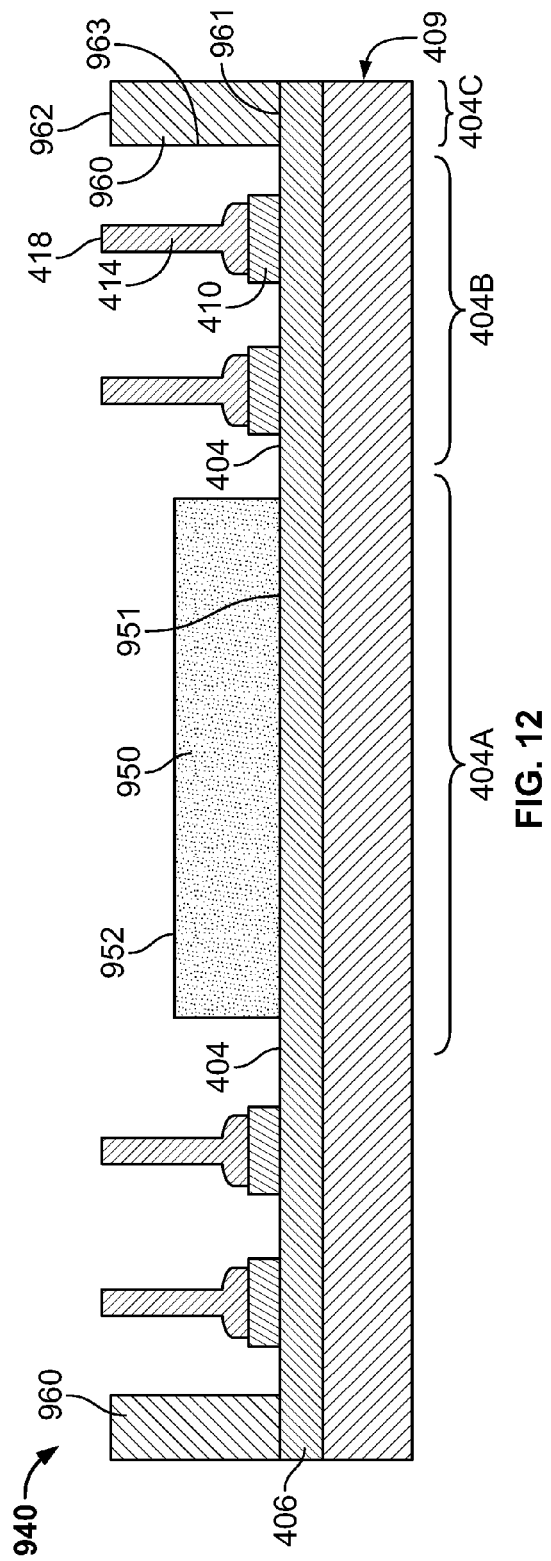
FIG. 12 is diagrammatic sectional of an in-process unit including a plurality of thermally conductive elements according to an embodiment of the disclosure.
Figure 13:
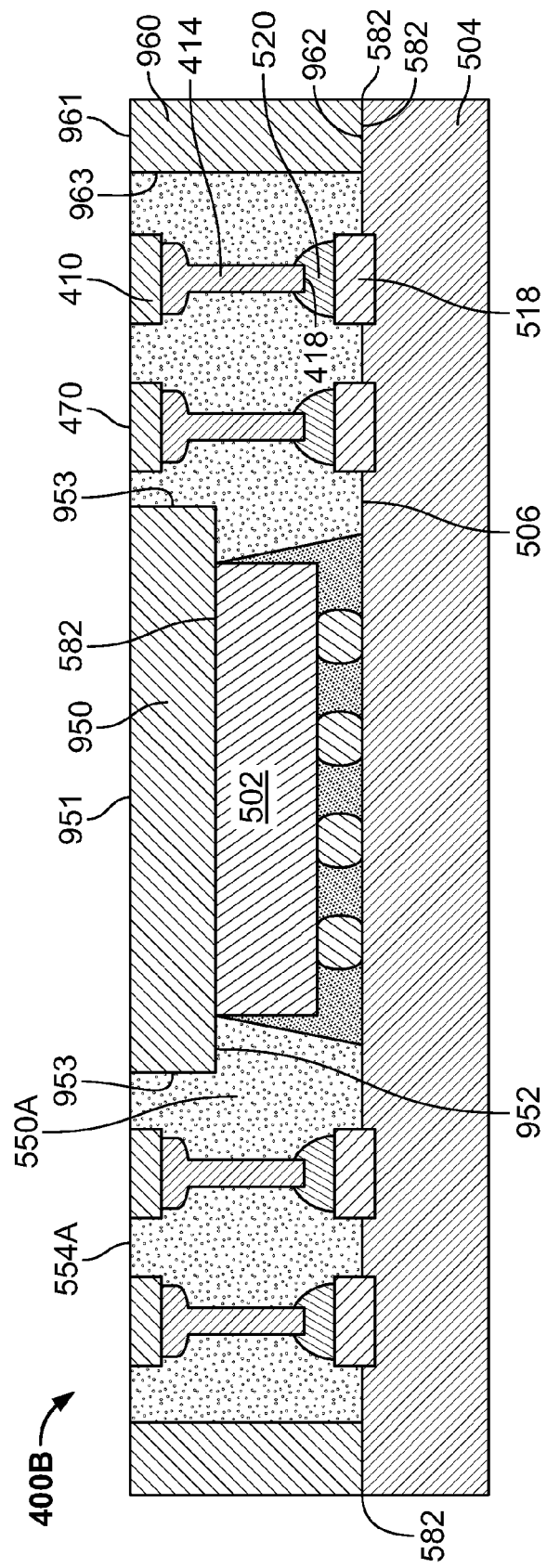
FIG. 13 is a diagrammatic sectional view of a microelectronic package including the in-process unit of FIG. 12 and a microelectronic assembly according to an embodiment of the disclosure.

In another embodiment, a microelectronic package 400B, as illustrated in FIG. 13, may include thermally conductive elements to remove heat from a microelectronic element and a substrate of a microelectronic assembly, such as the microelectronic assembly 500 illustrated in FIG. 7. The package 400B may be formed similarly and include similar components as described above for the package 400, except that an in-process unit 940, which includes similar components as the in-process unit 440 depicted in FIG. 6 and further includes thermal elements 950 and 960 as shown in FIG. 12 to provide for thermal dissipation, may be used to join wire bonds 414 and the thermal elements to the assembly 500. Referring to FIG. 12, thermal element 950 may be attached to surface 404 with an adhesive in a first region 404A that lies within a second region 404B of the release layer 406 and includes a central portion of the in process-unit 940 and extends outwardly therefrom. The second region 404B substantially surrounds the region 404A and extends outwardly therefrom to a third region 404C, which substantially surrounds the region 404B and extends outwardly therefrom to the outer edges of the in-process unit 940. The wire bonds 414 and the conductive elements 410 are within the region 404B. The thermal element 950 may be mounted at a surface 951 thereof remote from a surface 952 by adhesive (not shown) to the surface 404 within first region 404A, and the thermal element 960 may be mounted by adhesive at a surface 961 remote from a surface 962 to the surface 404 within the region 404C. The in-process unit 940 may then be joined to the microelectronic assembly 500, which is in a same or similar processing state as illustrated in FIG. 7, where, similarly as in the package 400, the ends 418 of the wire bonds 414 are joined through the conductive masses 520 to the conductive elements 518. In addition, thermally conductive material 582, which may be at a portion of the surface 506 facing the surface 962 or on the surface 962, may attach the element 960 with the surface 506. In one embodiment, the thermally conductive element 960 may have a frame shape so as least partially surround the region 404B of surface 506 of the package 404A at which the wire bonds 414 are disposed.

After joining the wire bonds 414 and thermal elements 950 and 960 to the assembly 550, an encapsulation layer 550A from a dielectric material may be formed over uncovered portion between the release layer 406 of the in process unit 940 and the surface 506, similarly as described above. In the embodiment of FIG. 13, the encapsulation layer 550A may be formed over the same uncovered portions and elements as in the package 400 illustrated in FIG. 8. In addition, the encapsulation layer 550A may be formed on portions of surface 952 of the thermal element 950 not covered by thermal adhesive 582, and opposing surfaces 953 of the thermal element 950 extending from the surface 951 to the surface 952, and a surface 963 of the thermal element 960 extending from the surface 961 and 962 and facing the wire bonds 414. The encapsulation layer 550A may define a major surface 554A, which is remote from the surface 506 of the substrate 504. Similarly as in the package 400, after removal of the release layer and temporary substrate, surfaces 470 of the conductive elements 410, which are remote from the surfaces of the conductive elements 410 to which the bases 416 are joined, remain uncovered by the encapsulation layer 550 within the major surface 554A, and furthermore surfaces 961 and 951 of the thermal elements 960 and 950, respectively, remain uncovered. Accordingly, heat generated during operation of the package by the microelectronic element 502 and the substrate 504 may be transferred away therefrom by the thermal elements 950 and 960 and the thermally conductive material 582, thereby avoiding damage to the package's electronic circuitry due to overheating.

The above-described embodiments and variations of the invention can be combined in ways other than as specifically described above. It is intended to cover all such variations which lie within the scope and spirit of the invention.

The invention claimed is:

1. A microelectronic package comprising:
a substrate having a first surface and a second surface remote from the first surface;
at least one microelectronic element overlying a portion of the first surface, thereby defining a first region thereof, wherein a second region of the first surface is defined by another portion of the first surface disposed beyond the at least one microelectronic element;
electrically conductive elements at the first surface of the substrate within the second region;
a support structure having a third surface and a fourth surface remote from the third surface, the support structure overlying the second region of the first surface and not overlying the first region of the first surface, wherein the third surface faces the first surface, the support structure having second and third electrically conductive elements exposed respectively at the third and fourth surfaces, the second electrically conductive elements being electrically connected to the conductive elements at the first surface of the substrate in the first region; and
wire bonds defining edge surfaces and having bases electrically connected through ones of the third conductive elements to respective ones of the second conductive elements and ends remote from the support structure and the bases,
an integral continuous encapsulation region contacting the support structure, the substrate and at least edge surfaces of the wire bonds.

2. The microelectronic package of claim 1 wherein the encapsulation region extends from the first surface and covers portions of the wire bonds such that covered portions of the wire bonds are separated from one another by the encapsulation region, wherein unencapsulated portions of the wire bonds are defined by portions of the wire bonds that are uncovered by the encapsulation layer, the unencapsulated portions including the ends.

3. The microelectronic package of claim 1 further comprising:
a redistribution layer extending along at least a portion of at least one of the third surface or the fourth surface,
wherein the redistribution layer includes a redistribution substrate having a fifth surface adjacent the least one of the third surface or the fourth surface and a sixth surface remote from the fifth surface, first electrically conductive pads at the fifth surface of the redistribution substrate aligned with and contacting respective ones of the second or third electrically conductive elements at the third or fourth surfaces, and second electrically conductive pads at the sixth surface of the redistribution substrate electrically connected to the first conductive pads.

4. The microelectronic package of claim 1, wherein the second conductive elements are bonded to respective ones of the conductive elements at the first surface of the substrate by a conductive bonding material.

5. The microelectronic package of claim 1, wherein conductive vias of the support structure electrically connect ones of the bases of the wire bonds with respective ones of the second conductive elements at the third surface of the support structure.

6. The microelectronic package of claim 1, wherein the encapsulation region encapsulates the at least one microelectronic element.

7. The microelectronic package of claim 1, wherein the encapsulation region has a major surface remote from the first surface of the substrate, and ends of the wire bonds project above the major surface of the encapsulation region.

8. The microelectronic package of claim 1, wherein the support structure is in form of a frame surrounding an open, interior region having dimensions sufficient to receive the at least one microelectronic element therein.

9. The microelectronic package of claim 8, wherein the support structure surrounds the at least one microelectronic element.

10. The microelectronic package of claim 9, wherein the encapsulation region entirely covers the fourth surface of the support structure and the wire bonds extend through the encapsulation region.

* * * * *